United States Patent [19]

Barbee et al.

[11] 4,400,715

[45] Aug. 23, 1983

[54] THIN FILM SEMICONDUCTOR DEVICE AND METHOD FOR MANUFACTURE

[75] Inventors: Steven G. Barbee, Dover Plains, N.Y.; James M. Leas, Washington, D.C.; James R. Lloyd, Fishkill; Arunachala Nagarajan, Wappingers Falls, both of N.Y.

[73] Assignee: International Business Machines Corporation, Armonk, N.Y.

[21] Appl. No.: 208,442

[22] Filed: Nov. 19, 1980

[51] Int. Cl.³ .............................................. H01L 27/12
[52] U.S. Cl. ...................................... 357/49; 357/55; 357/4
[58] Field of Search ............................... 357/55, 49, 4

[56] References Cited

U.S. PATENT DOCUMENTS

| | | | |
|---|---|---|---|
| 2,992,903 | 7/1961 | Imber | 23/273 |
| 3,160,521 | 12/1964 | Ziegler et al. | 117/213 |
| 3,160,522 | 12/1964 | Heywang et al. | 117/229 |
| 3,348,962 | 10/1967 | Grossman et al. | 117/48 |
| 3,600,237 | 8/1971 | Davis et al. | 148/1.6 |
| 4,035,829 | 7/1977 | Ipri | 357/49 X |
| 4,046,618 | 9/1977 | Chaudhari et al. | 156/603 |
| 4,058,418 | 11/1977 | Lindmayer | 148/175 |
| 4,140,558 | 2/1979 | Murphy | 357/55 X |
| 4,196,041 | 4/1980 | Baghdadi et al. | 156/620 |
| 4,211,582 | 7/1980 | Horng | 357/55 X |
| 4,252,579 | 2/1981 | Ho | 357/49 X |

OTHER PUBLICATIONS

IBM Technical Disclosure Bulletin, vol. 19, No. 10, Mar. 1977, pp. 3955 and 3956, entitled "Crystallization of Silicon for Solar Cell Applications", by R. J. von Gutfeld.

Primary Examiner—Martin H. Edlow
Attorney, Agent, or Firm—Mitchell S. Bigel

[57] ABSTRACT

A process for the preparation of a semiconductor device in a thin film of a monocrystalline semiconductor material supported on the surface of a substrate. In the process a thin film of a monocrystalline semiconductor material is formed on a substrate. The film of monocrystalline semiconductor material is doped at various depths with various types and concentrations of dopants. Thereafter, contacts are established at various depths of the doped thin film. In one embodiment, a thin film of a non-monocrystalline semiconductor material is deposited on a substrate. The thin film of non-monocrystalline semiconductor material is doped in situ as it is being deposited with various doping impurities to provide various types and concentrations of doping impurities at various depths. The thin film of non-monocrystalline semiconductor material has at least one tapered region terminating in a point. The thin film of non-monocrystalline semiconductor material is traversed with a particle beam. The traverse is initiated at the point causing nucleation of a crystal at the point and subsequent growth of a monocrystalline thin film of semiconductor material from the point during the traverse. Contacts are then established at various depths to provide a semiconductor device, such as a bipolar transistor.

7 Claims, 10 Drawing Figures

THIN FILM SEMICONDUCTOR DEVICE AND METHOD FOR MANUFACTURE

BACKGROUND OF THE INVENTION

1. Field of the Invention

The present invention relates generally to a semiconductor device formed in a thin film monocrystalline semiconductor layer prepared on the surface of a substrate and a method for making same. More particularly, the present invention is directed to a process for the preparation of integrated circuit devices in a thin film of a monocrystalline semiconductor material supported on the surface of a substrate.

Semiconductor devices are most usually formed by diffusion and/or ion implantation of doping ions into a monocrystalline body of semiconductor material in combination with intricate and precise masking and etching steps. The semiconductor is usually a wafer of monocrystalline silicon cut from a cylinder of monocrystalline silicon which is drawn from a bath of molten silicon. Because of physical strength requirements a wafer of silicon which is many times thicker than is required for formation of the semiconductor devices is produced. The thickness required is related to the diameter, i.e., 0.203 mm for a 3.175 cm diameter, 0.330 mm for a 5.715 cm diameter and 2.235 mm for a 8.255 cm diameter wafer. The present invention is directed to semiconductor devices formed in a film of monocrystalline silicon supported on a substrate. In a preferred embodiment the present invention is directed to a process for the preparation of integrated circuit devices in a thin film of a monocrystalline semiconductor material formed from a thin film of polycrystalline semiconductor material by means of high energy annealing, such as by use of a laser beam.

2. Prior Art

Laser annealing is a rapidly emerging technology with great potential for use in semiconductor processing. A major advantage of laser annealing is that laser beams can heat localized regions to a high temperature for a short duration. Temperatures in excess of the melting temperature of the material can be attained. Laser annealing has primarily been proposed for use in healing the damage caused by ion implantation during the fabrication of resistors and transistors. Another area proposed for use of laser annealing is the fabrication of transistors and integrated circuits using silicon on sapphire technology.

Ion implantation is a technique that provides precise dosages of doping ions and the profile control needed for solid state device fabrication. The implanted atoms, however, produce considerable disruption of the semiconductor crystal lattice in the form of dislocations, stacking faults and dislocation loops which act as traps for charge carriers. Many of the implanted doping atoms are located at interstitial sites within the lattice. Consequently, they are not electrically active until additional processing moves them from the interstitial site into a substitutional position. This movement of atoms is most usually accomplished by heating the semiconductor wafer in a high temperature furnace. The technique of thermal annealing is only partially effective, however, and additional problems are introduced during the relatively long period required for temperature annealing.

Both pulse and CW-laser annealing of ion implantation damage have been found to restore crystallinity to the host lattice and to produce high electrical activation of doping atoms in silicon. Pulse-laser annealing provides a somewhat higher degree of crystallinity and electrical activation of implanted and deposited layers, but the pulse-laser technique results in some significant redistribution of the doping atom profile. CW-laser annealing provides a high degree of electrical activation without disturbing the implanted doping atom profile.

Experiments conducted by Hughes Research Laboratories, reported in Vacuum Technology-Industrial Research/Development, "Laser Annealing", November, 1979, pp. 141-152, indicate that healing of ion implant induced damage by laser annealing is the result of epitaxial growth through either solid-phase epitaxy of liquid-phase epitaxy, depending on the type of laser used. Such epitaxial growth induced by laser annealing is well known when the disrupted crystalline material is in contact with a monocrystalline source. As pointed out in the article, the time available for crystal regrowth during pulse-laser annealing is limited by heat conduction to approximately 1 microsecond. The extremely short time available for crystal regrowth has been thought to be a limitation on the use of laser annealing to form a crystalline material from a monocrystalline source. It has been thought that laser crystallization of thin-film amorphous silicon is by means of epitaxial silicon growth. As described in an article by J. C. Beam et al. "Epitaxial Laser Crystallization of Thin-Film Amorphous Silicon", Appl. Phys. Lett., Vol. 33, No. 3, Aug. 1, 1978, pp. 227-230, vapor-deposited amorphous silicon films of 4000Å thickness have been epitaxially crystallized when the films are located on the surface of monocrystalline substrates by pulse-laser radiation. The concept of epitaxial growth requires that the amorphous silicon to be recrystallized into the form of monocrystalline silicon be in contact with a monocrystalline source.

Some attempts have been made to recrystallize amorphous polycrystalline silicon thin film layers on the surface of amorphous substrates (see A. Gat et al., "Appl. Phys. Lett." 33,775 (1978). In the study of Gat et al. a 0.4 micrometer-thick continuous polycrystalline film having an initial average grain size of 500Å was prepared by low pressure chemical vapor deposition on a $Si_3N_4$ substrate. The film was held at a temperature of 350° C. during laser annealing. The annealing was accomplished with an Ar laser having an output of 11 W focused into a 40 micrometer spot and scanned across the film at a rate of 12 cm/sec. Under these conditions columnar crystallites were found to extend completely through the film to the nitride interface. The crystallites had a typical surface area of 2 micrometers by 10 micrometers and were found to develop at an angle to the direction of the scan, producing a chevron-like structure. The crystallites displayed a number of crystal orientations with no indication of a preferred orientation. Such columnar crystallites, of course, do not constitute the formation of a monocrystalline silicon material useful for the preparation of semiconductor devices.

The ability to form thin layers of monocrystalline silicon on the surface of amorphous substrates is of immense importance in furthering the art of large scale integrated semiconductor devices. Such ability to form thin layers of monocrystalline semiconductor material can be used to provide multilayer semiconductor devices, thus drastically increasing the density of the device.

Accordingly, it is a principal object of the present invention to provide a process for the preparation of integrated circuit devices in a thin film of a monocrystalline semiconductor material supported on the surface of a substrate.

Another object of the present invention is to provide a thin film of a monocrystalline semiconductor material on the surface of an amorphous substrate having integrated circuit devices formed therein or thereon.

A further object of the present invention is to provide integrated circuit devices in a thin film of a monocrystalline semiconductor formed on the surface of a substrate by laser annealing.

BRIEF DESCRIPTION OF DRAWINGS

These and other objects of the present invention will become more apparent from the following detailed description and the accompanying drawings wherein.

SUMMARY OF THE INVENTION

The present invention is directed to a process for the preparation of integrated circuit devices in a thin film of a monocrystalline semiconductor material supported on the surface of a substrate. In accordance with one embodiment of the process, a thin film of a non-monocrystalline semiconductor material is deposited on a substrate. The film of semiconductor material is doped in situ, by ion implantation or by diffusion, with various types and amounts of doping impurities at various depths. For this embodiment, the thin film has at least one tapered region terminating in a point. The thin film is then traversed with a laser beam of sufficient intensity to cause melting of the thin film during the traverse. The traverse is initiated at the point thereby causing nucleation of a crystal at the point and subsequent growth of a monocrystalline thin film of the semiconductor material from the point through the body of the thin film during the laser traverse. The thin film of monocrystalline silicon can also be formed by affixing a thick body of monocrystalline silicon to a suitable substrate and reducing the thickness by a suitable method, such as by grinding or etching. Integrated circuit devices are then formed in or on the thin film by a non-critical block out mask technique.

DETAILED DESCRIPTION OF THE INVENTION

The process of the present invention will be described hereinbelow with particular reference to the use of polycrystalline silicon as the thin film of non-monocrystalline semiconductor material which is used. It should be understood that other thin films of amorphous semiconductor material, such as gallium arsenide and germanium can also be used. Also, the melting of the thin film of semiconductor material during traverse is described with particular reference to a laser beam. Other particle beams, such as electron beam and ion beam, which have sufficient energy to cause melting or solid state epitaxy during traverse of the thin film of semiconductor material are also suitable.

Figure 1:
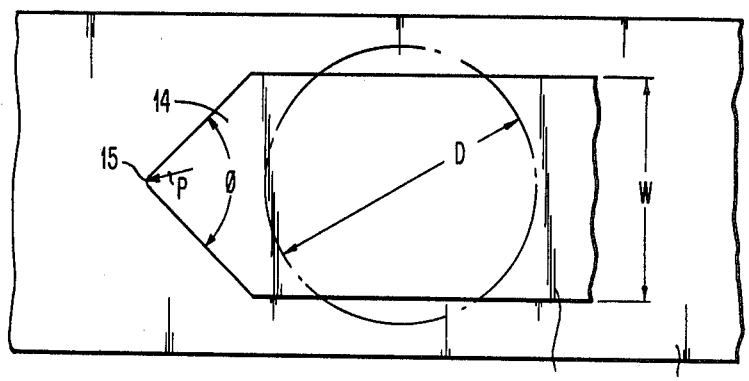
FIG. 1 is a top view, partially broken away, of a thin film of a semiconductor material which has been deposited on a substrate.
Figure 2:
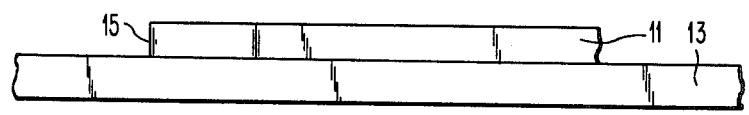
FIG. 2 is a side view of FIG. 1.

With reference to FIGS. 1 and 2, a thin film of polycrystalline silicon 11 is deposited on a substrate 13 by any suitable method. The polycrystalline silicon is not limited to any particular structure or grain size and can be amorphous. Any conventional method for applying thin films of polycrystalline silicon can be used. One suitable method for depositing the thin film of polycrystalline silicon is by low pressure chemical vapor deposition using an atmosphere of silane and nitrogen at about 650° C. Under these conditions a grain size of about 1000Å is attained. The thin film of polycrystalline silicon can be any suitable thickness as required by the conditions of forming semiconductor devices in subsequent processing steps. The maximum thickness of the polycrystalline film is determined by the power level of the laser or other particle beam used to effect melting of the polycrystalline silicon film. In general, thicknesses ranging from about 0.1 micron to about 100 microns are preferred, most preferably from about 0.2 micron to about 10 microns.

The substrate 13 onto which the polycrystalline silicon is deposited can be any material having suitable dielectric properties and which is resistant to melting during traverse by the laser or other particle beam. In general, inorganic passivating materials conventionally used in semiconductor processing are preferred, such as silicon nitride, silicon dioxide and aluminum oxide. The grain size and grain condition of the substrate is not critical and the substrate can be amorphous, polycrystalline or monocrystalline. Under some conditions, if careful control of the particle beam during the traverse of the polycrystalline thin film is observed, the substrate 13 can be a polymeric material, such as polyimide.

With particular reference to FIG. 1, other features of the invention are further illustrated. The polysilicon layer 11 is formed on the surface of the substrate 13 in a particular configuration. As shown in FIG. 1, the polycrystalline silicon layer 11 has at least one tapered region 14 which converges to a point 15. The angle of divergence $\theta$ from the point 15 is not critical. Preferably, the angle $\theta$ is in the range of from about 2° to about 120°. It is, of course, theoretically impossible to have the point 15 with a radius of curvature of 0. The radius of curvature R is preferably less than the grain size of the polycrystalline silicon. Practically, however, good results are obtained when the radius of curvature is in the range of from about 200Å to about 5000Å.

It is also possible to have the point connected to a second body of polycrystalline silicon, i.e. as a "neck" between two polycrystalline bodies. The thickness of the neck from which monocrystalline growth can be initiated is in the range of from about 200Å to about 5000Å.

The tapered region 14 can be formed by any suitable method such as by in situ formation by use of masking techniques during application of the layer 11 or by a subsequent etching or machining step.

Figure 3:
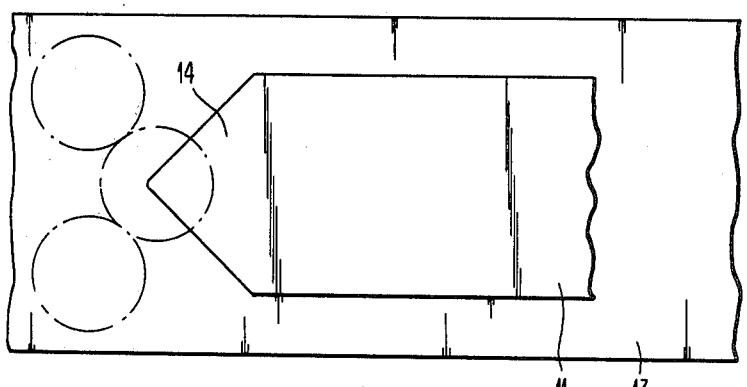
FIG. 3 is a top view of a thin film of a semiconductor material deposited on the surface of a substrate showing a further embodiment of the method of the invention.

As shown in FIG. 1, the polycrystalline silicon layer 11 has a width W. W is preferably less than the diameter D of the focused laser spot, shown in dotted outline in FIG. 1. Since the energy of the focused laser spot is less at the periphery of the spot, it is preferred that the width W of the thin film of polysilicon 11 be from about 60 to about 90% of the diameter D of the focused spot. It should be understood, however, that the width W of the thin film of polysilicon 11 can be any desired dimension. The method of the invention can be used to form a stripe of monocrystalline silicon in a polycrystalline thin film body or multiple passes can be used to traverse the thin film of polysilicon 11 in a step and repeat fashion if the width W of the polysilicon layer is greater than the focus spot of the laser beam. Alternatively, as shown in FIG. 3 multiple laser beams can be used in a single pass to initiate nucleation at point 15 and cause conversion of the non-monocrystalline polysilicon layer 11 to monocrystalline silicon.

The type of laser, wavelength of the laser light, power density and other factors will vary according to the thickness of the polycrystalline silicon layer 11. For example, a 4000Å layer of polycrystalline silicon was deposited on a silicon nitride substrate by chemical vapor deposition. The polycrystalline silicon layer terminated in a tapered region having an angle $\theta$ of 3° and a point having a radius of curvature of 300Å. A continuous Ar laser was used at 900–1200 KW/cm$^2$ which was focused at a 39 $\mu$m spot. This was found to produce a monocrystalline silicon stripe having a width of 20 $\mu$m from the polycrystalline silicon when the laser was traversed at a rate of 1.9 cm/sec.

In another example a 5500Å layer of polycrystalline silicon was chemically vapor deposited on a silicon dioxide substrate. The polycrystalline silicon layer had a tapered region having an angle $\theta$ of 50° and a radius of curvature R of 350Å. A continuous Ar laser used at a power of 750–900 KW/cm$^2$, focused at a 40 micrometer spot and traversed at a scanning rate of 1.9 cm/sec. was sufficient to cause conversion of the polycrystalline silicon to 20 $\mu$m stripe of monocrystalline silicon.

In a further example, a 4200Å polycrystalline silicon layer 11 was chemically vapor deposited onto a silicon nitride substrate. The polycrystalline silicon layer 11 had a tapered region having an angle $\theta$ of 4° and a radius of curvature R of 300Å. An Ar laser was used having a focused spot of 75–100 $\mu$m. The laser was operated at 12–14 W which was equivalent to 190–320 KW/cm$^2$. The laser traversed the polycrystalline silicon layer at a scanning rate of 2 cm/second to convert the polycrystalline silicon to a 20 $\mu$m stripe of monocrystalline silicon.

During the scanning of the polycrystalline silicon with the laser beam, it is preferred that the polycrystalline silicon film be heated to a temperature in the range of from about 200° to about 400° C. to minimize laser power required for crystallization of the polycrystalline silicon. This will also reduce damage caused by thermal expansion effects. In this connection, the particle beam source, whether laser, electron beam or ion beam, should have an energy intensity sufficient to permit sufficient heating of the polycrystalline silicon layer while traversing the polycrystalline silicon layer at a speed in the range of from about 0.5 to about 5 cm/sec. Such speed of traverse results in rapid heating and cooling and minimizes any thermal expansion damage defects.

The ability to convert polycrystalline silicon to monocrystalline silicon in accordance with the process of the present invention provides a greatly simplified route to the manufacture of integrated circuit devices, such as resistors, diodes, bipolar transistors and FET transistors. A process for the manufacture of a bipolar transistor and a Schottky barrier diode (SBD) is shown in schematic form in FIGS. 4–9.

Figure 4:
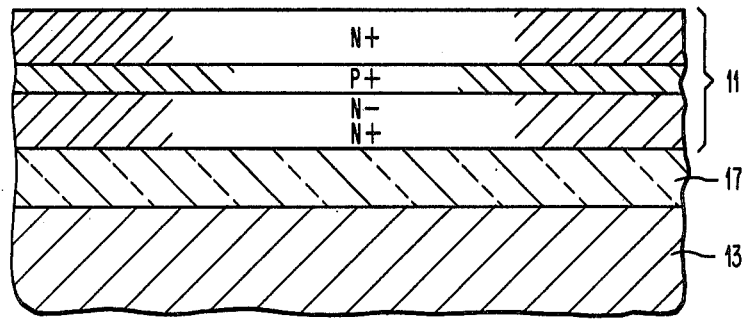
FIG. 4 is a schematic side view, partially broken away, showing a polycrystalline silicon layer deposited on the surface of a substrate having various levels and types of doping atoms dispersed throughout the polycrystalline layer.

Referring to FIG. 4, a substrate 13 is provided which can be any suitable material as previously described. The substrate 13 can be polycrystalline silicon, metal, an oxide of silicon or metal, monocrystalline silicon, glass, ceramic or plastic. A passivating layer 17, such as silicon nitride, is then blanket deposited onto the substrate by a suitable method, such as chemical vapor deposition. The silicon nitride covers the entire substrate. It should be understood, however, that the silicon nitride layer is not necessary if the substrate itself is a passivating material, such as quartz. The layer 17 can be any dielectric with low fixed charge which is deposited at low temperature.

As shown in FIG. 4 a polycrystalline silicon layer is then deposited which is doped in situ as it is deposited with a suitable level and type of doping atom. As shown, three layers of polycrystalline silicon are deposited. The first layer has a varying level of n-type dopant atoms, such as phosphorus or arsenic. The second layer is doped with a p-type dopant, such as boron. The last layer of polycrystalline silicon is doped with a high level of an n-type dopant such as phosphorus or arsenic. The three layers are used, as described hereinbelow, for formation of the subcollector, base and emitter of an npn type bipolar transistor. As shown in FIG. 4, the subcollector profile is preferably tailored to provide a low doping level near the base and a higher doping level near the oxide layer for a low resistance path to the collector contact which is subsequently formed.

The polycrystalline silicon layer is then formed or is formed during the deposition step into a shape having a tapered region terminating in a point as previously described hereinabove. The polycrystalline silicon layer is then converted from the polycrystalline form to a monocrystalline form by solid phase laser annealing as heretofore described. As described, the point is a unique nucleation site and is the first place to cool and nucleate a crystal. The scanning laser moves from the point into the body of the polycrystalline silicon causing expitaxial growth on the nucleated crystal or the subsequently recrystallized material. Once started, recrystallization proceeds rapidly at the rate of scanning which means that little redistribution of the in situ doped impurities occurs.

An alternative method for doping is to first provide the thin monocrystalline silicon layer on the substrate followed by ion implant and/or diffusion of dopants. The dopants are implanted and/or diffused to provide the desired profile followed by a low temperature or laser anneal to activate the dopants.

Figure 5:
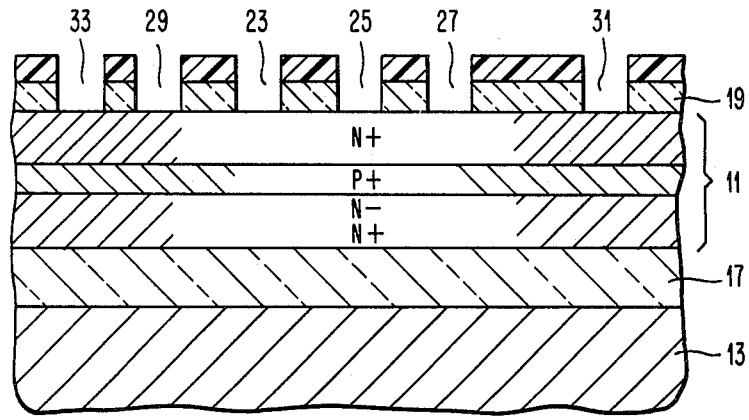
FIGS. 5-9 are sectional views, dimensionally exaggerated, of the polycrystalline silicon layer of FIG. 4 deposited on a substrate showing subsequent steps for the fabrication of an integrated circuit device.

A layer of silicon dioxide 19 and a layer of photoresist 21 are then applied, as shown in FIG. 5. The first masking step in the process is then performed. The photoresist is exposed and developed to open all of the contacts required for the bipolar transistor and the isolation. An anisotropic reactive ion etching is then used to etch through the oxide layer 19, stopping at the surface of the silicon layer 11.

Figure 6:
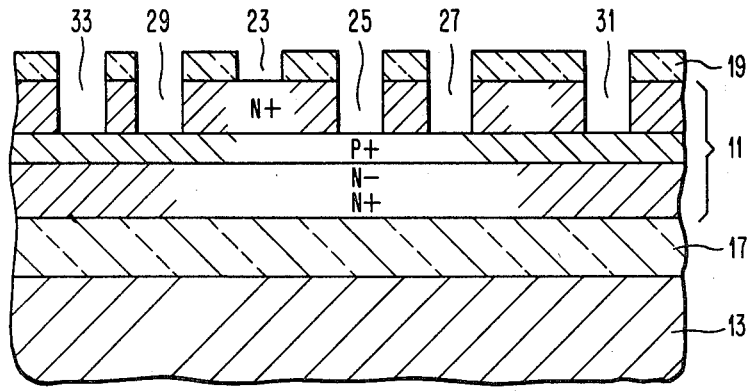

As best seen in FIGS. 5 and 6, block out masking is then used to cover the emitter contact 23 and the remaining contacts are reactive ion etched using SF$_6$ or Ar/Cl. The reactive ion etching step proceeds at a known rate for a controlled time through the emitter layer to the surface of the base layer. The etch depth is not critical and over etching into the base layer to a depth of several hundred Angstroms is permissible.

Figure 7:
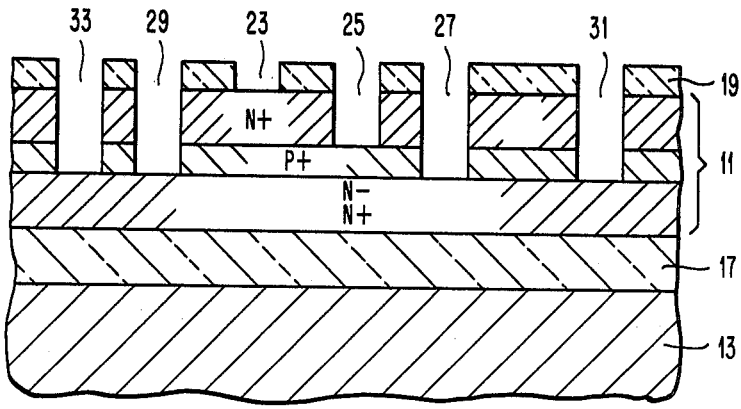
Figure 8:
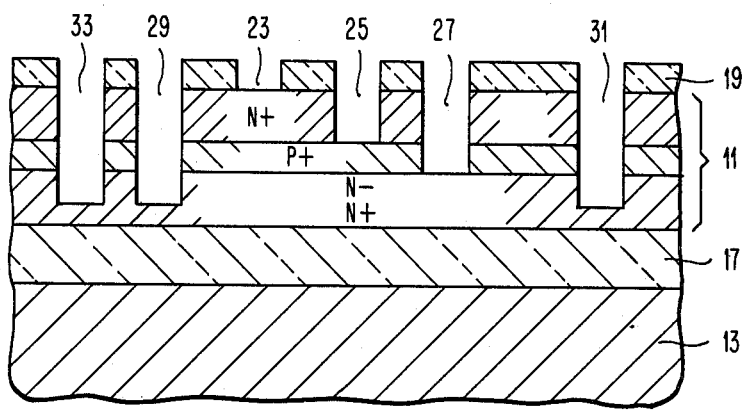

As shown in FIG. 7, a block out mask is used to cover the base contact 25 and the emitter contact 23 while the remaining contacts are reactive ion etched through the base layer to the surface of the subcollector layer. Again, the etch depth is not critical. A block out mask is then used to cover the Schottky barrier diode contact 27, the base contact 25 and the emitter contact 23. Reactive ion etching is used to extend the collector contact 29 and the isolation region 31 and 33 into the subcollector region. A final block out mask is used to cover all contacts except the isolation regions 31 and 33 and reactive ion etching is used to extend the depth of the isolation regions 31 and 33 to the surface of the oxide layer 17.

Figure 9:
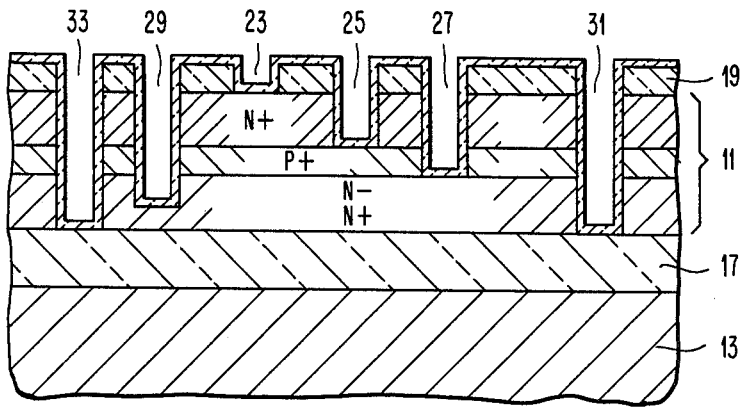

A layer of silicon dioxide is then deposited over the surface of the device by chemical vapor deposition. The resulting structure is shown in FIG. 9. An anisotropic reactive ion etch is then used to open up all the contacts leaving the oxide on the sidewalls of the contact holes to prevent metal shorting of the junctions. A block out mask is used during this step to prevent removal of the oxide in the isolation areas 31 and 33. Platinum is evaporated onto the wafer and annealed to form platinum silicide for the collector, the emitter, the base and the Schottky barrier diode. Standard metallization is then applied in accordance with known procedures.

Figure 10:
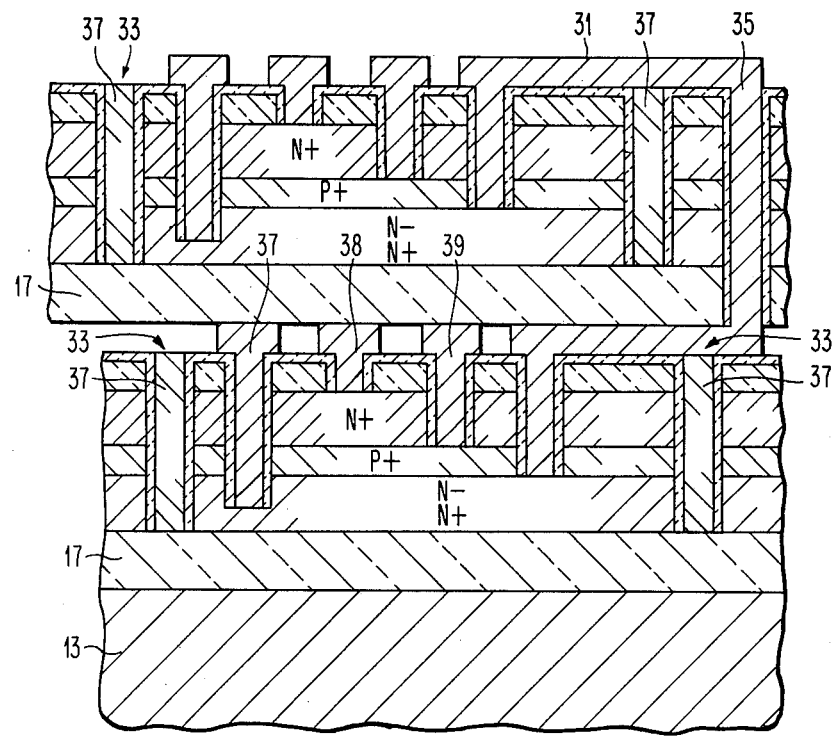
FIG. 10 is a sectional view of a multilayered semiconductor device prepared by the method shown in FIGS. 5-9.

A particular advantage of the method for forming bipolar transistors as set forth hereinabove is that none of the masks required are critical masks. Except for the initial development of the photoresist, all of the masks are block out masks and no critical masks are needed in the process. A further advantage, is that the process is described hereinabove can be repeated in a multiple layer configuration to provide multiple levels of semiconductor devices which are wired as completed by suitable metallization patterns. Semiconductor device density can then be configured in a three dimensional array. A typical two-layer device is shown in FIG. 10 showing metallization 35 connecting the Schottky barrier diodes of two bipolar transistors. Polysilicon 37 is shown filling the isolation trenches 31 and 33. Further metallization 37, 38 and 39 is connected to the collector, emitter and base, respectively, of one of the transistors.

While several embodiments of the invention, together with modifications thereof, have been described in detail herein and illustrated in the accompanying drawings, it will be evident that various further modifications are possible without departing from the scope of the invention.

What is claimed is:

1. A thin film semiconductor device comprising:
a substrate including at least one surface which is of a insulating dielectric material, a plurality of overlying layers of doped monocrystalline semiconductor material united to the insulating dielectric material, said doped monocrystalline layers being converted doped polycrystalline semiconductor material, a plurality of circuit elements in the layers, selected trenches isolating the circuit elements from each other, an insulating layer on the surface of the overlying layers and on the vertical surfaces of the trenches, and a metallization pattern contacting the circuit elements through the remaining trenches whereby a full dielectric isolation of the circuit elements is achieved in the device.

2. The device of claim 1 wherein the substrate consists of polycrystalline silicon the surface of which being covered by a blanket dielectric layer with low fixed charge.

3. The device of claim 1 or 2 wherein the plurality of overlying layers comprises three layers of silicon;
the first layer having a varying level of N type dopant;
the second layer being doped with a P type dopant, and
the third layer being doped with a high level of N type dopant
whereby the three layers form the subcollector, base and emitter of a transistor structure.

4. The device of claim 3 wherein the doping profile of the first layer for the subcollector is tailored to provide a low doping level near the base and a higher doping level near the substrate.

5. The device of claim 1 further comprising platinum silicide contacts connected to at least part of said metallization pattern.

6. The device of claim 1, 2, 4, or 5 further comprising additional levels of full dielectric isolated circuit elements atop of each other, the dielectric material of an overlying level being adjacent to the metallization pattern of an underlying level, whereby three dimensional multilevel device arrays are provided.

7. The device of claim 6 further comprising a polysilicon filling of the isolation trenches of the individual device structures.

* * * * *